United States Patent

Ahn et al.

[11] Patent Number: 6,036,781
[45] Date of Patent: Mar. 14, 2000

[54] APPARATUS FOR GUIDING AIR CURRENT IN A WAFER LOADING CHAMBER FOR CHEMICAL VAPOR DEPOSITION EQUIPMENT

[75] Inventors: Yo-han Ahn, Seoul; Jin-chul Yoon; Chang-jip Yang, both of Suwon; Ho-wang Kim, Seoul, all of Rep. of Korea

[73] Assignee: Samsung Electronics Co., Ltd., Suwon, Rep. of Korea

[21] Appl. No.: 08/825,223

[22] Filed: Mar. 19, 1997

[30] Foreign Application Priority Data

Apr. 4, 1996 [KR] Rep. of Korea ............ 95-10292

[51] Int. Cl.[7] ................................. C23C 16/00
[52] U.S. Cl. ................. 118/715; 118/724; 414/935; 414/937
[58] Field of Search .................. 118/724, 715; 414/935, 937, 938, 939, 940

[56] References Cited

U.S. PATENT DOCUMENTS

| | | | |
|---|---|---|---|
| 5,181,819 | 1/1993 | Sakata et al. | 414/217 |
| 5,221,201 | 6/1993 | Yamaga et al. | 432/241 |
| 5,261,935 | 11/1993 | Ishii et al. | 55/213 |
| 5,277,579 | 1/1994 | Takanabe | 432/5 |
| 5,378,283 | 1/1995 | Ushikawa | 118/719 |
| 5,388,944 | 2/1995 | Takanabe et al. | 414/217 |
| 5,433,785 | 7/1995 | Saito | 118/719 |
| 5,447,294 | 9/1995 | Sakata et al. | 266/257 |
| 5,536,320 | 7/1996 | Ushikawa et al. | 118/719 |
| 5,551,984 | 9/1996 | Tanahashi | 118/724 |
| 5,562,383 | 10/1996 | Iwai et al. | 414/217 |
| 5,810,538 | 9/1998 | Ozawa et al. | 414/217 |

*Primary Examiner*—Jeffrie R Lund
*Attorney, Agent, or Firm*—Jones Volentine, LLP

[57] ABSTRACT

An air current guiding apparatus includes a plurality of dampers installed on a filter unit on an inner wall of air supply unit for blowing clean air over wafers loaded in a boat for transfer to a reaction chamber for chemical vapor deposition. Each of the dampers has a certain length and angular orientation to force the air in a designated direction so that the air current in a wafer loading chamber maintains an appropriate velocity and is free from air turbulence, thereby minimizing the number of contaminating particles in the wafer loading chamber.

8 Claims, 5 Drawing Sheets

APPARATUS FOR GUIDING AIR CURRENT IN A WAFER LOADING CHAMBER FOR CHEMICAL VAPOR DEPOSITION EQUIPMENT

BACKGROUND OF THE INVENTION

1. Field of the Invention

The present invention relates to an apparatus for guiding the air current in a wafer loading chamber for chemical vapor deposition equipment, and in particular to an apparatus having an improved air intake unit to supply ultra-clean air to a boat containing wafers before or after a low pressure chemical vapor deposition process.

2. Background of the Related Art

Generally, semiconductor wafers are used, for among others, Read-Only Memory (ROM), Random-Access Memory (RAM), and Integrated Circuits (IC). The wafer becomes ROM or RAM of a certain memory capacity, or an IC containing particular circuits, after conventional oxidation, diffusion, deposition, etching, and packaging processes.

Chemical Vapor Deposition (hereinafter, referred to as CVD) is the most widely adopted technology for the deposition process on the wafer. CVD may be classified into Atmospheric Pressure CVD (hereinafter, referred to as APCVD), Low Pressure CVD (hereinafter, referred to as LPCVD), and Plasma Enhanced CVD (hereinafter, referred to as PECVD). LPCVD is generally used to produce MOS integrated circuits, charge coupled devices (hereinafter, referred to as CCDS), and various transistors. LPCVD has the following characteristics: outstanding uniformity in thickness and electric resistance between wafers and in the wafer; reduced natural doping from the reaction chamber to a wafer because of the low temperature and pressure; and economical operation because many wafers can be processed simultaneously. LPCVD also maintains the distribution of impurities formed in the wafer before the deposition process because it utilizes a low temperature process. In view of these above listed characteristics, LPCVD is used to form a nitride or an oxidized film on a wafer.

Generally, an LPCVD apparatus is divided into a reaction chamber and a wafer loading chamber. The reaction chamber, having a certain inside temperature and ambience, is an apparatus that forms a thin film on wafers loaded on a boat. The wafer loading chamber is an apparatus that loads wafers for deposition of a film on the boat and then transports them to the reaction chamber, or unloads wafers after the deposition process on the boat. There is also an apparatus for supplying gases such as $SiH_4$, $N_2O$, $PH_3$, and $N_2$, and a ventilation system to maintain clean internal air and to prevent it from contamination due to impure particles.

An upright LPCVD apparatus generally has a loading chamber installed under a reaction chamber. The reaction chamber is equipped with a gas intake device. The wafer loading chamber has a device for supplying and discharging clean air to shower the wafers with air to prevent their contamination by impure particles.

FIG. 1A is a top view of an upright LPCVD apparatus and FIG. 1B is a side view of the same. A robot (not shown) placed in the wafer loading chamber loads wafers onto a boat 12 or moves wafers on a boat 12 to a carrier in order to transport wafers in lot units for subsequent processes. The boat 12 is installed in the wafer loading chamber and moves up and down in order to load many wafers into the reaction chamber for deposition. A filter 14 for the filtration of incoming air is on a wall and a plurality of outlets 16 are on the opposing wall to discharge inside air to an outside exhaust device (not shown).

In the LPCVD apparatus constructed as in FIG. 1A and FIG. 1B, clean air should be supplied into the wafer loading chamber 10 at a velocity of 0.2–0.4 m/s for effective removal of impurities on a wafer. However, the surface area of the filter 14 is not large enough for the inside capacity of the wafer loading chamber 10 in the conventional upright LPCVD apparatus shown in FIG. 1A and FIG. 1B. Also, the wafers on the boat 12 are not placed directly in front of the air inlet and, in consequence, the air flowing in from the filter 14 does not proceed directly to the wafers on the boat 12, but rather forms an air current as marked by the arrows in FIG. 1A. Therefore, small particles from other areas such as the robot may contaminate the wafers through the air current.

The air is especially turbulent near the boat 12 because of the improper placement of outlets 16, and the air turbulence interferes with the removal of impurities. The number of particles per unit area is about 100–300 according to measurements, and thus these particles may contaminate the wafers.

The air path after the filter 14 is also affected by the turbulence. That is, near the boat 12, which is a sensitive area for the impurity removal from wafers, a dead point 18, namely, the point where the air current speed is abruptly reduced down to 0–0.2 m/s, is formed and, in consequence, the air current after the dead point does not contribute to the cleanliness of the wafers and the boat.

To solve the above problems in the prior art, the size and position of the filter 14 must be changed accordingly. However, it is not easy to modify or replace the filter installation because of the substantial cost involved with structural modifications of expensive semiconductor manufacturing instruments that are already set up. Also, modifications to the lay-out of the installation is not desirable due to structural correlations between instruments.

SUMMARY OF THE INVENTION

Accordingly, it is an object of the invention to provide an apparatus for guiding the air current of a wafer loading chamber of CVD equipment, which prevents wafers that are loaded onto a boat in the loading chamber of CVD equipment from being contaminated by impure particles generated from other areas of the chamber.

Another object of the invention is to provide an apparatus for guiding the air current of a wafer loading chamber of CVD equipment, in which wafers that are loaded onto a boat in the loading chamber of CVD equipment are showered with clean air in order to effectively remove impurities on the wafers.

A further object is to provide an apparatus for guiding the air current of a wafer loading chamber of CVD equipment, which guides air currents of the chamber so that the air supplied into the chamber flows with appropriate speeds at each place without air turbulence.

In order to realize these and other objects, an air current guiding means for forcing certain air currents are installed onto the inner wall of an air-supplying unit to ensure cleanliness of wafers loaded onto the boat.

The air current guiding means includes a plurality of dampers, and is installed at the clean air inlet filter. It is preferable to install the air current guiding means in such a way that a small portion of the filter closest to the boat is occupied by the air current guiding means. The air flowing into the chambers is increased because of the guiding means. The cleanliness of the wafers, loaded onto a boat before or after the chemical deposition process, is greatly enhanced because they are free from any impure particles in the chambers.

In addition to the above advantages, the wafers are showered with the clean air right after it comes out of the filter so that the contamination of wafers is greatly reduced and the utilization of wafers is increased.

BRIEF DESCRIPTION OF THE ATTACHED DRAWINGS

DETAILED DESCRIPTION OF PREFERRED EMBODIMENT

Figure 2:
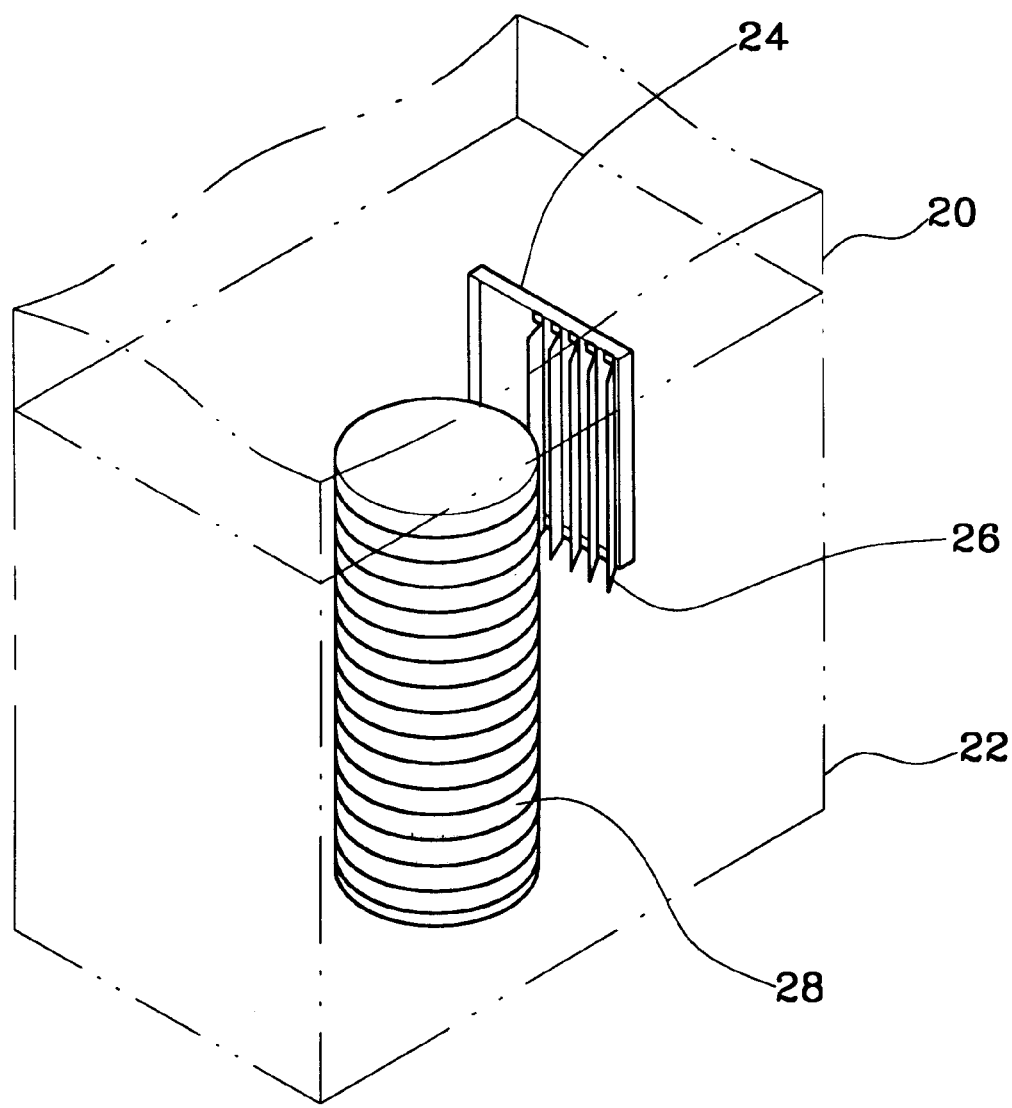
FIG. 2 is a schematic perspective view of a wafer loading chamber for CVD equipment according to the present invention.

Referring to FIG. 2, a preferred embodiment of the present invention comprises a plurality of dampers 26 installed on the filter 24, which is located in a wafer loading chamber 22, which in turn is located under a reaction chamber 20. The dampers 26 guide a portion of the air filtered by the filters 24 to flow toward the boat 28.

Figure 3:
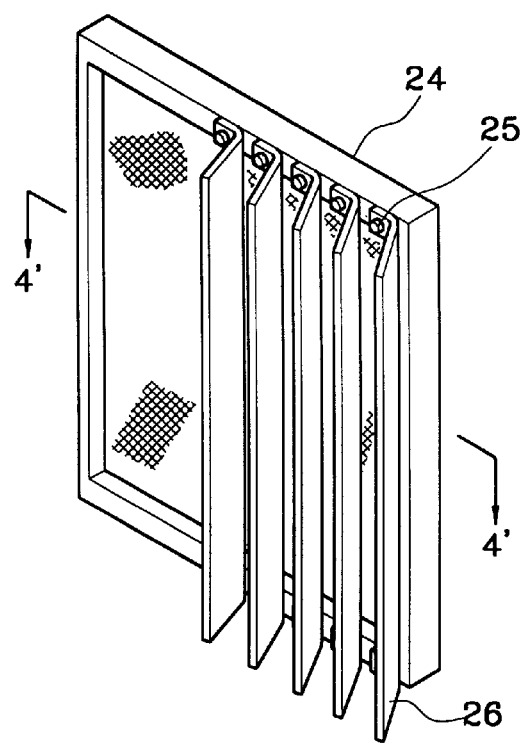
FIG. 3 is a perspective view of dampers installed in the air-intake filters in the present invention.

In FIG. 3, the dampers 26 installed on the filter 24 are connected via conventional methods, for example, a bolt connection 25, but any equivalent method can be used as long as it minimizes the impurity generation. Several dampers 26 are installed onto a small portion of the filters closest to the boat 28.

Figure 4:
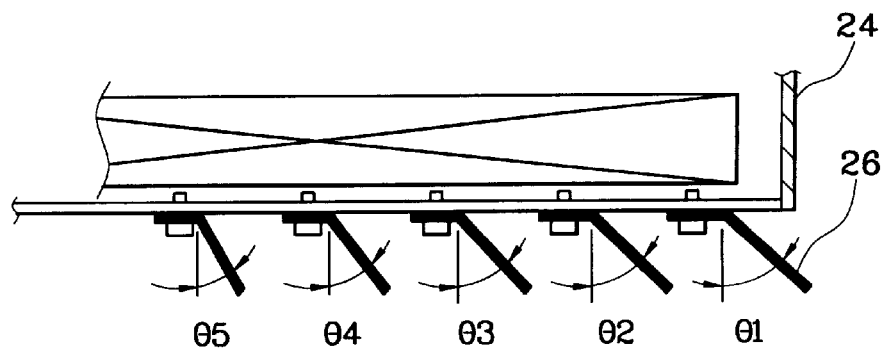
FIG. 4 is a partial cutaway perspective view taken along line 4'—4' in FIG. 3.

Referring to FIG. 4, the orientation and length of each damper are adjusted to guide the air current to the boat 28. For example, in a preferred embodiment, the guiding angles to the boat are adjusted such that $\theta_1 > \theta_2 > \theta_3 > \theta_4 > \theta_5$. The guiding angles are defined as those obtuse angles that are subtended between the dampers 26 and the plane of the opening across which the dampers 26 are mounted. The angles shown in FIG. 4 are those portions of the guiding angles which extend beyond 90°. The lengths are adjusted in such a way that the length of a damper closer to the boat 28 is longer than the length of the dampers farther from the boat 28. The guiding angles can be varied in a range such that the orientation of the dampers 26 guides the air current directly to the boat 28 while avoiding the robot 30 as shown in FIG. 5.

Figure 5:
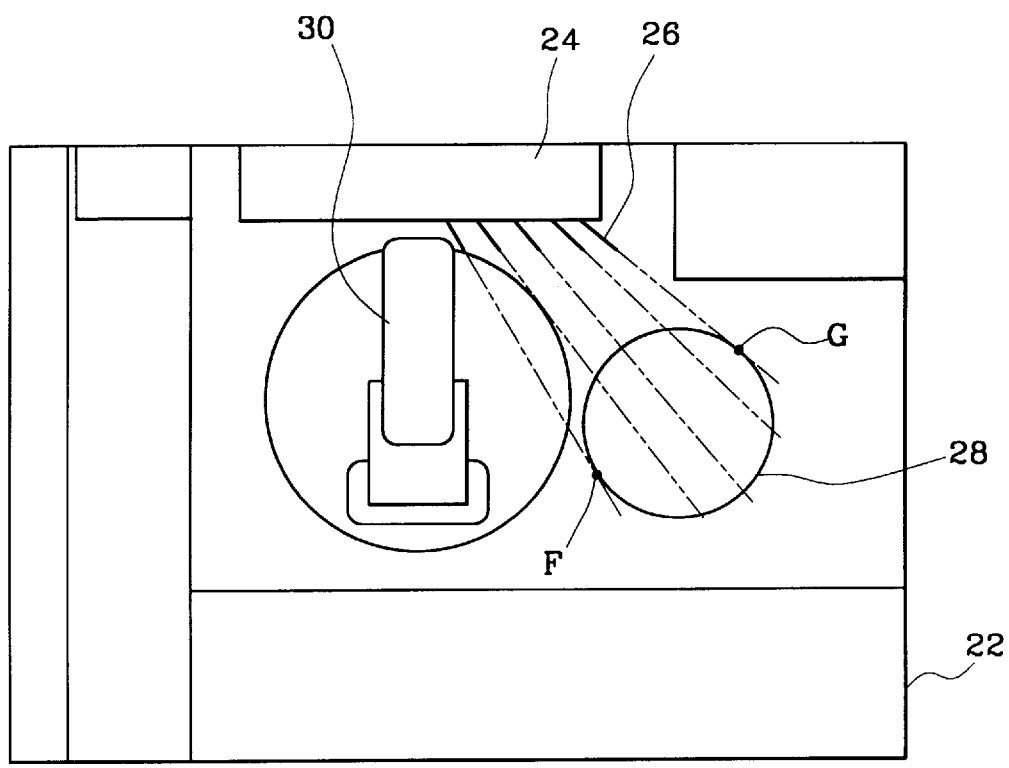
FIG. 5 is a top view of the present invention, showing the relative positions of the dampers and a boat in the wafer loading chamber.

Preferably, the orientation of dampers 26 on both ends should be construed in such a way that if the lengths of the end dampers were extrapolated, then each extrapolated line would tangentially contact the arcuate circumference of the boat at points F and G located opposite one another as shown in FIG. 5. Since the guiding angles for each damper differ, the remaining middle dampers shown in FIG. 5 have different extrapolated, or reference line orientations from one another and with respect to the end dampers. With the construction shown in FIG. 2 and FIG. 5, the air current from the filter 24 to the exit drains 32 is formed as in FIG. 6A and FIG. 6B.

An air supply unit blows air into the system through the filter 24 in order to remove impurities from each wafer on a boat before or after the CVD process. The air guided by the dampers 26 flows via the boat 28 and exits through the drain 32 while the air not guided by the dampers 26 forms a natural current to remove impurities on the other parts, such as the robot 30, and exits through the drain 32. So, the impurities on the boat 28 or the wafers are directly removed by the clean air which was just cleaned by the filter 24, and eventually exists the system through the drain 32.

Figure 6A:
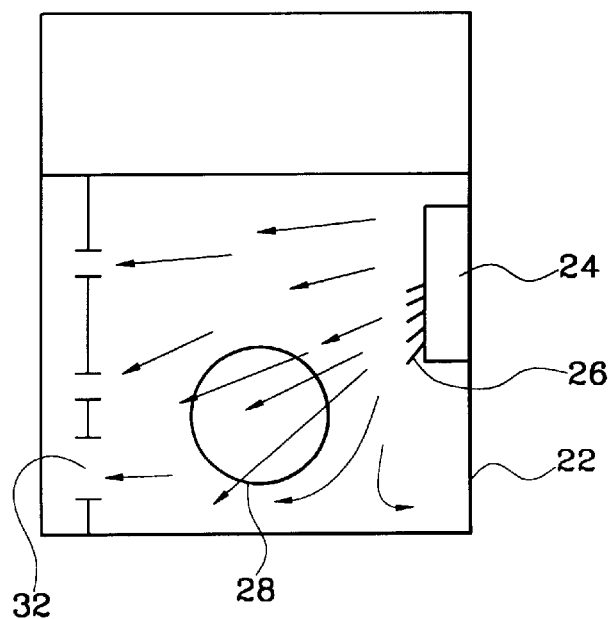
FIG. 6A is a top view of the wafer loading chamber in a CVD apparatus.
Figure 6B:
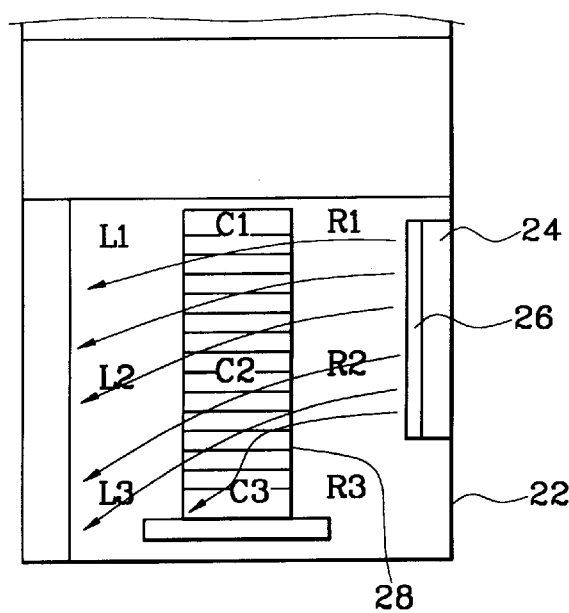
FIG. 6B is a side view of the wafer loading chamber in a CVD apparatus.

The velocity of the air current generated by a fan can be maintained at about 0.2 m/s–0.4 m/s, because the air current is free from air turbulence as shown in FIG. 6A.

Figure 1A:
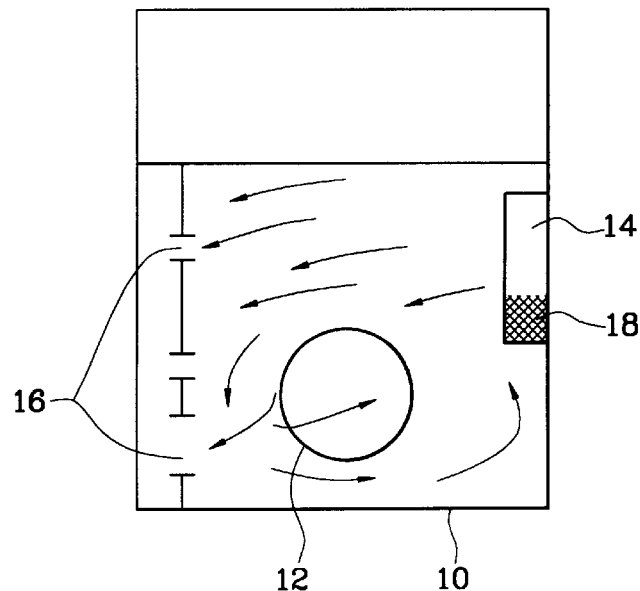
FIG. 1A is a top view of a wafer loading chamber for a conventional CVD apparatus.
Figure 1B:
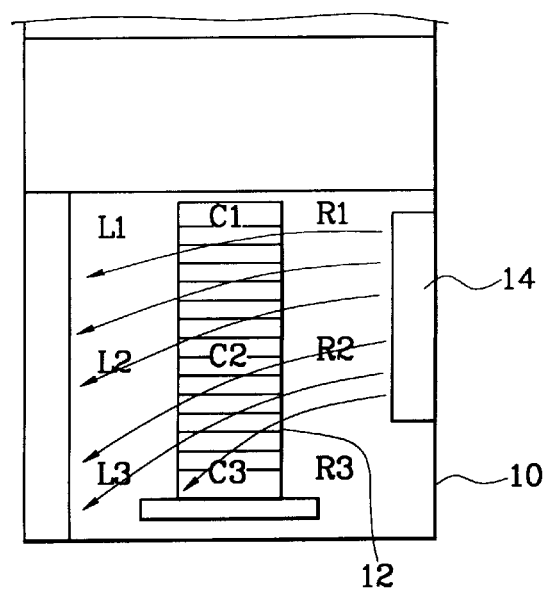
FIG. 1B is a side view of the wafer loading chamber for a conventional CVD apparatus.

To measure the number of particles in a wafer loading chamber equipped with the embodiment of the invention, one of the most widely used particle counters, Met-One Particle Counter 2100 was used to count the particles having a diameter larger than 0.2 $\mu$m. The result is summarized in TABLE 1 (refer to FIG. 1B and FIG. 6B for the L1, C1, R1 etc. locations).

TABLE 1

| | | PARTICLE COUNTS | | | | | | | | |
|---|---|---|---|---|---|---|---|---|---|---|
| | | Top Part | | | Middle Part | | | Bottom Part | | |
| | | Of The Boat | | | | | | | | |
| | | L1 | C1 | R1 | L2 | C2 | R2 | L3 | C3 | R3 | Total |
| Prior Art | | 39 | 78 | 343 | 1 | 38 | 115 | 24 | 44 | 92 | 774 |
| Present | #1 | 3 | 2 | 4 | 3 | 0 | 5 | 1 | 1 | 0 | 19 |
| Invention | #2 | 1 | 3 | 0 | 1 | 0 | 0 | 1 | 3 | 0 | 12 |
| | #3 | 0 | 0 | 3 | 0 | 2 | 0 | 0 | 0 | 0 | 5 |
| | #4 | 0 | 1 | 1 | 0 | 0 | 0 | 0 | 0 | 0 | 2 |
| | Mean | 1 | 1.5 | 2 | 1 | 0.5 | 1.25 | 0.5 | 1 | 0.75 | 9.5 |

According to TABLE 1, the average number of particles, which was a substantial number prior to using the present invention, is greatly reduced, down to 0–2 throughout every position. TABLE 1 indicates that the damper 26 guides the air current to the boat 28 and, in consequence, the impurities from other areas exit through the drain 32 without contaminating wafers on the boat 28. In addition, the impurities on the wafers are removed by the air current effectively.

When this embodiment is applied to a wafer loading chamber of an LPCVD, the air current of the chamber is guided to discharge impurities and is not disturbed by air turbulence, so that the number of particles in the chamber, and hence the contamination of the wafer, is minimized as shown in TABLE 1. As a result, the wafer is utilized to the maximum extent. The installation of this embodiment to an existing CVD apparatus is easily accomplished.

We have described in detail one particular embodiment. However, it is understood that various modifications or variations are possible without departing from the scope and spirit of the invention as set forth in the appended claims.

What is claimed is:

1. In chemical vapor deposition equipment having a wafer loading chamber, a reaction chamber in which wafers are subjected to chemical vapor deposition, and a wafer boat movable between a first position in the wafer loading chamber and a second position in the reaction chamber so as to transfer wafers loaded in the boat from the loading chamber to the reaction chamber, an air supply unit for blowing clean air into the wafer loading chamber, said air supply unit defining an opening in a wall of the loading chamber and through which opening the clean air is blown into the loading chamber, said opening being laterally offset from the wafer boat when the wafer boat is in said first position thereof, and said air supply unit comprising a plurality of dampers extending across said opening in directions parallel to the longitudinal axis of the wafer boat when the boat is in said first position thereof, each of said dampers being angled so as to lie in a respective plane intersecting the wafer boat when the boat is in said first position thereof, and each said plane subtending an obtuse guiding angle with the plane of said opening so that said dampers form an air current flowing in a designated direction straight from said dampers directly to the wafer boat when the wafer boat is in said first position thereof.

2. In the chemical vapor deposition equipment as in claim 1, said air supply unit comprising an air filter to which said plurality of dampers are mounted.

3. In the chemical vapor deposition equipment as in claim 2, said air filter having first and second parts disposed side-by-side, said first part being located closer to the wafer boat than said second part when the wafer boat is in said first position thereof, and wherein all of the dampers which are mounted to said filter are only disposed over said first part of said filter.

4. In the chemical vapor deposition equipment as in claim 2, the wafer boat having an arcuate outer circumferential portion, and wherein said plurality of dampers consist of two end dampers and middle dampers disposed between said end dampers, the plane in which one of said end damper lies tangentially contacting the arcuate circumferential portion of said boat at a first point, the plane in which the other end damper lies tangentially contacting the arcuate circumferential portion of said boat at a second point opposite to said first point, and the planes in which the middle dampers lie being skewed relative to one another and to the planes in which the end dampers lie.

5. In the chemical vapor deposition equipment as in claim 4, wherein each of the guiding angles are different from one another, and each first one of the dampers that is closer to the wafer boat than a second one of the dampers subtends a larger said guiding angle than does said second one of the dampers.

6. In the chemical vapor deposition equipment as in claim 1, the wafer boat having an arcuate outer circumferential portion, and wherein said plurality of dampers consist of two end dampers and middle dampers disposed between said end dampers, the plane in which one of said end dampers lies tangentially contacting the arcuate circumferential portion of said boat at a first point, the plane in which the other end damper lies tangentially contacting the arcuate circumferential portion of said boat at a second point opposite to said first point, and the planes in which the middle dampers lie being skewed relative to one another and to the planes in which the end dampers lie.

7. In the chemical vapor deposition equipment as in claim 6, wherein each of the guiding angles are different from one another, and each first one of the dampers that is closer to the wafer boat than a second one of the dampers subtends a larger said guiding angle than does said second one of the dampers.

8. In the chemical vapor deposition equipment as in claim 1, wherein each of said plurality of dampers has a designated length as taken in a direction toward the wafer boat when it is in said first position thereof, and the designated length of each said dampers is greater for those of said dampers that are mounted closer to the wafer boat than the others of the dampers in order to increase directional selectivity of the air current and thus inhibit air turbulence.

\* \* \* \* \*